(12) United States Patent
Richards et al.

(10) Patent No.: US 8,227,763 B2
(45) Date of Patent: Jul. 24, 2012

(54) ISOLATION CIRCUIT FOR TRANSMITTING AC POWER TO A HIGH-VOLTAGE REGION

(75) Inventors: Steven Richards, Georgetown, MA (US); Geoffrey Ryding, Manchester, MA (US); Theodore Smick, Essex, MA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 503 days.

(21) Appl. No.: 12/411,048

(22) Filed: Mar. 25, 2009

(65) Prior Publication Data

US 2010/0243912 A1    Sep. 30, 2010

(51) Int. Cl.
*H01J 27/00* (2006.01)
(52) U.S. Cl. .......... 250/423 R; 250/424; 250/492.1; 250/492.2; 250/492.3; 336/182; 323/215; 323/247; 323/301; 323/305; 323/355
(58) Field of Classification Search ........... 323/215, 323/247, 301, 305, 328, 355; 336/182; 250/423 R, 250/424, 492.1, 492.2, 492.21, 492.3
See application file for complete search history.

(56) References Cited

U.S. PATENT DOCUMENTS

| | | | |
|---|---|---|---|
| 4,163,151 A | 7/1979 | Bayless et al. | |
| 4,510,476 A * | 4/1985 | Clatterbuck et al. | ........ 336/84 C |
| 5,350,926 A | 9/1994 | White et al. | |
| 5,374,564 A | 12/1994 | Bruel | |
| 5,811,823 A | 9/1998 | Blake et al. | |
| 5,818,181 A * | 10/1998 | Ballard | .......... 315/276 |
| 6,130,436 A | 10/2000 | Renau et al. | |
| 6,146,979 A | 11/2000 | Henley et al. | |
| 6,528,391 B1 | 3/2003 | Henley et al. | |
| 6,927,148 B2 | 8/2005 | Ito | |
| 7,223,984 B2 | 5/2007 | Reyes et al. | |
| 7,687,786 B2 | 3/2010 | Parrill et al. | |
| 7,750,322 B2 | 7/2010 | Parrill et al. | |
| 7,839,254 B2 * | 11/2010 | Dinsmore et al. | ............ 336/212 |
| 2008/0038908 A1 | 2/2008 | Henley | |
| 2009/0081848 A1 | 3/2009 | Erokhin et al. | |
| 2010/0141234 A1 * | 6/2010 | Dinsmore et al. | ............ 323/355 |

FOREIGN PATENT DOCUMENTS

EP    0491313 B1    10/1996

OTHER PUBLICATIONS

Litton, Carl. "On the Trail of a MegaVolt," Raleigh-Bartlett Science Club, Nov. 10, 2004, <http://www.pupman.com/hvlistarchives/2004/Nov/msg00050.html>.
Calvert, J.B., "Power Supplies and Voltage Regulators" Jul. 8, 2002, <http://mysite.du.edu/~etuttle/elect9.htm>.
Iqbal et al., *A Bipolar Cockcroft-Walton Voltage Multiplier for Gas Lasers*, American Journal of Applied Sciences, 4 (10): 795-801, 2007 <scipub.org/fulltext/ajas/ajas410795-801.pdf>.
Untitled drawing <http://www.altair.org/projects/MOTstack.gif>.
Glukhoy et al., "Characterization of a High-density Plasma Immersion Ion Implanter with Scaleable ECR Large-area Plasma Source," pp. 172-179, Surface & Coating Technology 196, 2005.

(Continued)

*Primary Examiner* — Michael Maskell
(74) *Attorney, Agent, or Firm* — Cesari and McKenna, LLP

(57) ABSTRACT

A sequence of series-connected transformers for transmitting power to high voltages incorporates an applied voltage distribution to maintain each transformer in the sequence below its withstanding voltage.

21 Claims, 4 Drawing Sheets

OTHER PUBLICATIONS

White, Nicholas R., "Moore's Law: Implications for Ion Implant Equipment—An Equipment Designer's Perspective," pp. 355-359, Proc. 11$^{th}$ Intl. Conf. Ion Implant Technology (ITT), 1997.

McKenna, C.M., "A Personal Historical Perspective of Ion Implantation Equipment for Semiconductor Applications," Proc. 13$^{th}$ Intl. Conf. Ion Implant Technology (ITT) 19 pages, 2000.

Rose, P.H., "A History of Commercial Implantation," Nuclear Instruments and Methods in Physics Research B6, pp. 1-8, North-Holland, Amsterdam, 1985.

Rose, P.H., "A History—Mainly About Ion Implantation Equipment Since 1984," Proc. 12$^{th}$ Intl. Conf. Ion Implant Technology (ITT) 17 pages, 1999.

Beith et al. "Advanced Implantation and Development of General Purpose Unlimited Lifetime ECRIS for Application on Implantation Devices," pp. 400-402, Caen, 14000, France, 1999.

Kato et al. "Production of Multiply Charged Ions by Utilizing Pulsed ECR Plasma," pp. 448-451, Toyama Prefectural University, 1999.

Ryding, G. "Target Chambers for Ion Implantation Using Mechanical Scanning," pp. 239-251, North-Holland, 1981.

L.S.Steen et al., "The Precision Implant 9000, A New Concept in Ion Implantation Systems," pp. 328-333, North Holland Physics Publishing Division, 1987.

Sundstrom et al., "Introducing the ULE2 Implanter," pp. 184-187, Eaton Corporation, 1999.

Graf et al., "The ULE2 Ion Source Capabilities Important to SOI Technology," pp. 308-311, Eaton Corporation, 1999.

Tokiguchi et al., "Improvements of Microwave Ion Source for 300mm-diameter SIMOX Wafer Production," pp. 296-299, Hitachi, Ltd., 1999.

L. Wegmann, "Historical Perspective and Future Trends for Ion Implantation Systems," pp. 1-6, Nuclear Instruments and Methods 189, North Holland Publishing, 1981.

Ito et al. "Microwave Ion Source for Ultra Clean Ion Implanters" pp. 558-561, Applied Materials Japan, 1999.

Hahto et al., "Multicusp Ion Source with External RF Antenna for Production of Protons," pp. 355-359, Review of Scientific Instruments, vol. 75, No. 2, Feb. 2004.

Blake, J. and Steve Richards, "The Ibis i2000 SIMOX Ion Implanter," Proc. 14$^{th}$ Intl. Conf. Ion Implant Technology (ITT), 2002.

Sato et al., "Introducing the ORion II NV7392 Flat Panel Ion Doping System," Proc. 14$^{th}$ Intl. Conf. Ion Implant Technology (ITT), 2002.

Jiang et al., "Development if a 27.12 MHz Radio Frequency Driven Ion Source with 3 m Torr Operation Pressure for Neutron Generators," Review of Scientific Instruments, vol. 76, 2005.

A. Renau, "The Beam Line Architecture of the VIISta 810 Medium Current Ion Implanter," Presented at 12$^{th}$ Annual Conference on Ion Implantation Technology, Report 312, Jun. 1998.

Brendel, Rolf, "Technological Approaches to Thin-Film Cells " *Thin Film Crystalline Silicon Solar Cells: Physics and Technology*, Wiley-VCH, 2003, pp. 91-120.

Ziegler, J. F., ed., *Ion Implementation-Science and Technology*, Annapolis, MD: Ion Implantation Technology, Co., 2004, pp. ii, iv-vi, 1-1 to 1-43, 2-1 to 2-42, 3-1 to 3-30, 7-1 to 7-38, 8-1 to 8-40, 9-1 to 9-33, 11-0 to 11-28, 12-1 to 12-40, 13-1 to 13-41, and 14-1 to 14-37.

Ziegler, J. F., ed., *Ion Implementation-Science and Technology*, Poughkeepsie, NY: Ion Implantation Technology, Co., 1996, pp. ii-v, 391-464, and 465-510.

\* cited by examiner

ISOLATION CIRCUIT FOR TRANSMITTING AC POWER TO A HIGH-VOLTAGE REGION

BACKGROUND OF THE INVENTION

1. Field of the Invention

The invention relates to voltage isolation systems for transmitting power across large voltages.

2. Background Information

High voltages, in excess of 100 kV, are commonly used in manufacturing. A manufacturing structure may include dedicated power supplies for maintaining some modules at a high relative AC or DC potential. These modules frequently include machinery that requires significant AC power in order to function.

One conventional approach to delivering AC power to a high-voltage module positions an isolation transformer between the high-voltage module and its power source. The voltage to which the power can be delivered by this arrangement is limited by the maximum voltage the isolation transformer can support across its windings without failing, known as the withstanding voltage of the isolation transformer.

For a given set of isolation transformer design parameters, such as acceptable transformer size and weight and available dielectric material, conventional technology imposes a practical upper limit on the achievable withstanding voltage and, thus, on the voltage to which AC power can be transmitted using this approach. For example, off-the-shelf dry-type transformers, such as epoxy-cast isolation transformers, generally have withstanding voltages less than 200 kV. Oil-filled transformers with higher withstanding voltages may be commercially available but are generally larger and heavier than dry-type transformers and introduce additional engineering complexity and safety hazards to the equipment.

There is, accordingly, a need for a system enabling transmission of power across voltages on the order of several hundred kilovolts.

SUMMARY OF THE INVENTION

A series-transformer isolation circuit adapted to transmit power from a lower potential to a higher potential comprises a transformer sequence of at least two transformers coupled in series. Starting with the first transformer of the sequence, the secondary winding of each transformer, except the last transformer in the sequence, is connected to the primary winding of the following transformer of the sequence. Each secondary winding and the following primary winding to which it is connected form an inter-transformer coupling.

A voltage apparatus is configured to apply a desired voltage between the primary winding of the first transformer and the secondary winding of the last transformer of the sequence. The voltage apparatus distributes the desired voltage in fractional portions over the multi-transformer sequence so that each transformer in the sequence is subject to a voltage lower than its withstanding voltage across its primary and secondary windings. The series-transformer isolation circuit acts as an isolation transformer having a withstanding voltage equal to the applied desired voltage.

Power provided at the primary winding of the first transformer in the sequence is available from the secondary winding of the last transformer in the sequence at the applied desired voltage.

BRIEF DESCRIPTION OF THE DRAWINGS

The invention description below refers to the accompanying drawings, wherein identical reference symbols designate like structural elements, and in which.

Features in the figures are not, in general, drawn to scale.

DETAILED DESCRIPTION OF AN ILLUSTRATIVE EMBODIMENT

Figure 1:
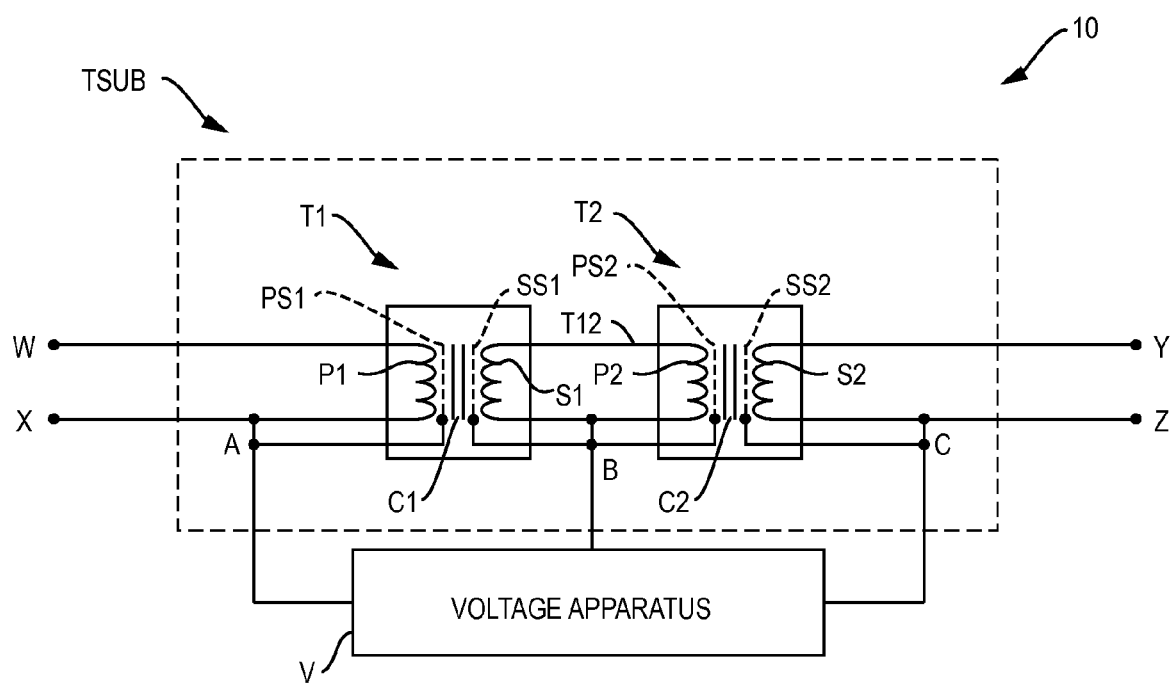
FIG. 1 schematically depicts a series-transformer isolation circuit having one inter-transformer coupling constructed in accordance with the invention.

With reference to FIG. 1, an illustrative series-transformer isolation circuit 10 comprises a sequence of transformers including a first transformer T1 connected in series with a second transformer T2. The first transformer T1 has a primary winding P1, a secondary winding S1, and a core C1. Conductive primary shield PS1 and secondary shield SS1 wrap the primary winding P1 and secondary winding P2, respectively. The second transformer T2 has a primary winding P2, a secondary winding S2, and a core C2, with conductive shields PS2 and SS2 wrapping the primary and secondary windings, P2 and S2, respectively. The transformers T1 and T2 may be dry-type or liquid-filled transformers. In one embodiment, T1 and T2 are both vacuum-cast epoxy-insulated transformers with laminated steel cores C1 and C2, known to those skilled in the art.

The primary shields PS1 and PS2 are electrically connected to their respective primary windings P1 and P2. The secondary shields SS1 and SS2 are electrically connected to their respective secondary windings S1 and S2.

The primary winding P1 of the first transformer T1 has input terminals W and X for receiving power from an AC source (not shown). The secondary winding S1 of the first transformer T1 is electrically connected to the primary winding P2 of the second transformer T2 to form a first inter-transformer coupling T12. The secondary winding S2 of the secondary transformer T2 has output terminals Y and Z for delivering power to a load (not shown) at high voltage. The first and second transformers T1 and T2 joined at the first inter-transformer coupling T12 constitute a two-transformer subsystem TSUB.

The numbers of turns in the windings P1, S1, P2, and S2 may be identical. Alternatively, the turns ratios of the two transformers T1 and T2 may be related in some other way compatible with how the transmitted power is provided at the input terminals W and X and used at the output terminals Y and Z.

A voltage apparatus V is configured to apply a DC or AC voltage distribution to the transformer subsystem TSUB. The voltage distribution features a total voltage, applied between the primary winding P1 and the secondary winding S2, at terminal points A and C; a first fractional voltage, between the primary winding P1 and the first inter-transformer coupling T12, at terminal points A and B; and a second fractional voltage, between the first inter-transformer coupling T12 and the secondary winding S2, at terminal points B and C. The voltage apparatus V may comprise, e.g., two distinct voltage sources, each providing one of the fractional voltages, in series. Alternatively, the voltage apparatus may be a single source having an intermediate tap connected to terminal point B. The function of the series-transformer isolation circuit 10 does not in general require that any current be drawn from the voltage apparatus V.

The imposed voltage distribution is intended to ensure that neither of the transformers T1 and T2 is electrically stressed beyond its capacity. Namely, the voltage apparatus V is configured to maintain the first fractional voltage, between the terminal points A and B, less than the withstanding voltage of the first transformer T1 and the second fractional voltage, between terminal points B and C, less than the withstanding voltage of the second transformer T2. Thus the series-transformer isolation circuit 10 functions as an isolation transformer with a withstanding voltage equal to the total applied voltage without stressing either of the transformers T1 and T2 beyond its withstanding voltage.

In one embodiment, the withstanding voltages of the two transformers T1 and T2 are equal, and the terminal point B divides the total applied voltage evenly so that the first and second fractional voltages are equal. By making the fractional voltages each nearly as great as the single withstanding voltage of a component transformer T1 or T2, an effective withstanding voltage approaching double that of either of the transformers T1 and T2 alone may be achieved without transformer failure. With appropriate selection of the transformers T1 and T2 and the voltage distribution, the effective withstanding voltage of the two-transformer isolation circuit 10 may be greater than 150 kV, 200 kV, 250 kV, 300 kV or 450 kV.

In operation, the series-transformer isolation circuit 10 provides transmission of power received at the input terminals W and X from a base voltage at terminal point A to an operating voltage at terminal C. The transmitted power is available at output terminals Y and Z.

Figure 2:
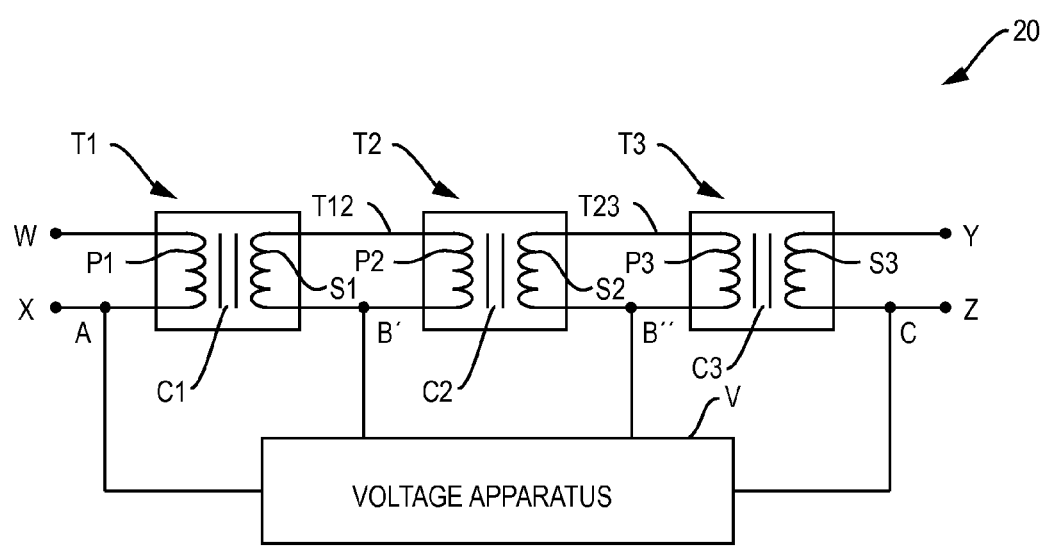
FIG. 2 schematically depicts a series-transformer isolation circuit having two inter-transformer couplings constructed in accordance with the invention.

The transformer sequence of the isolation circuit 10 of FIG. 1 is generalizable to a series connection of three or more transformers. FIG. 2 shows an illustrative three-transformer isolation circuit 20. The isolation circuit 20 comprises first, second and third transformers T1, T2 and T3, with the input terminals W and X of the first transformer T1 accessible to receive power from an AC source, and the first and second transformers T1 and T2 joined as described for the two-transformer sequence of the isolation circuit 10. In the three-transformer isolation circuit 20, the secondary winding S2 of the second transformer T2 is electrically connected to the primary winding P3 of the third transformer T3 to form a second inter-transformer coupling T23. The secondary winding S3 of the third transformer T3 has output terminals Y and Z for delivering power to a load (not shown) at high-voltage. The first, second and third transformers T1, T2 and T3 joined in series at the first and second inter-transformer couplings T12 and T23 constitute a three-transformer subsystem.

The voltage apparatus V is configured to apply a voltage distribution over the three-transformer subsystem. The voltage distribution includes a total voltage, applied between the primary winding P1 and the secondary winding S3, at terminal points A and C; a first fractional voltage, between the primary winding P1 and the first inter-transformer coupling T12, at terminal points A and B'; a second fractional voltage, between the first inter-transformer coupling T12 and the second inter-transformer coupling T23, at terminal points B' and B''; and a third fractional voltage, between the second inter-transformer coupling T23 and the secondary winding S3, at terminal points B'' and C. By holding the terminal points B' and B'' of the isolation circuit 20 at appropriate potentials, the illustrated configuration may provide an aggregate withstanding voltage approaching the sum of the withstanding voltages of the three component transformers T1, T2 and T3 without breakdown. Thus, the three-transformer isolation circuit 20 may provide an aggregate withstanding voltage greater than, e.g., 500 kV, 600 kV, or 700 kV.

Figure 3:
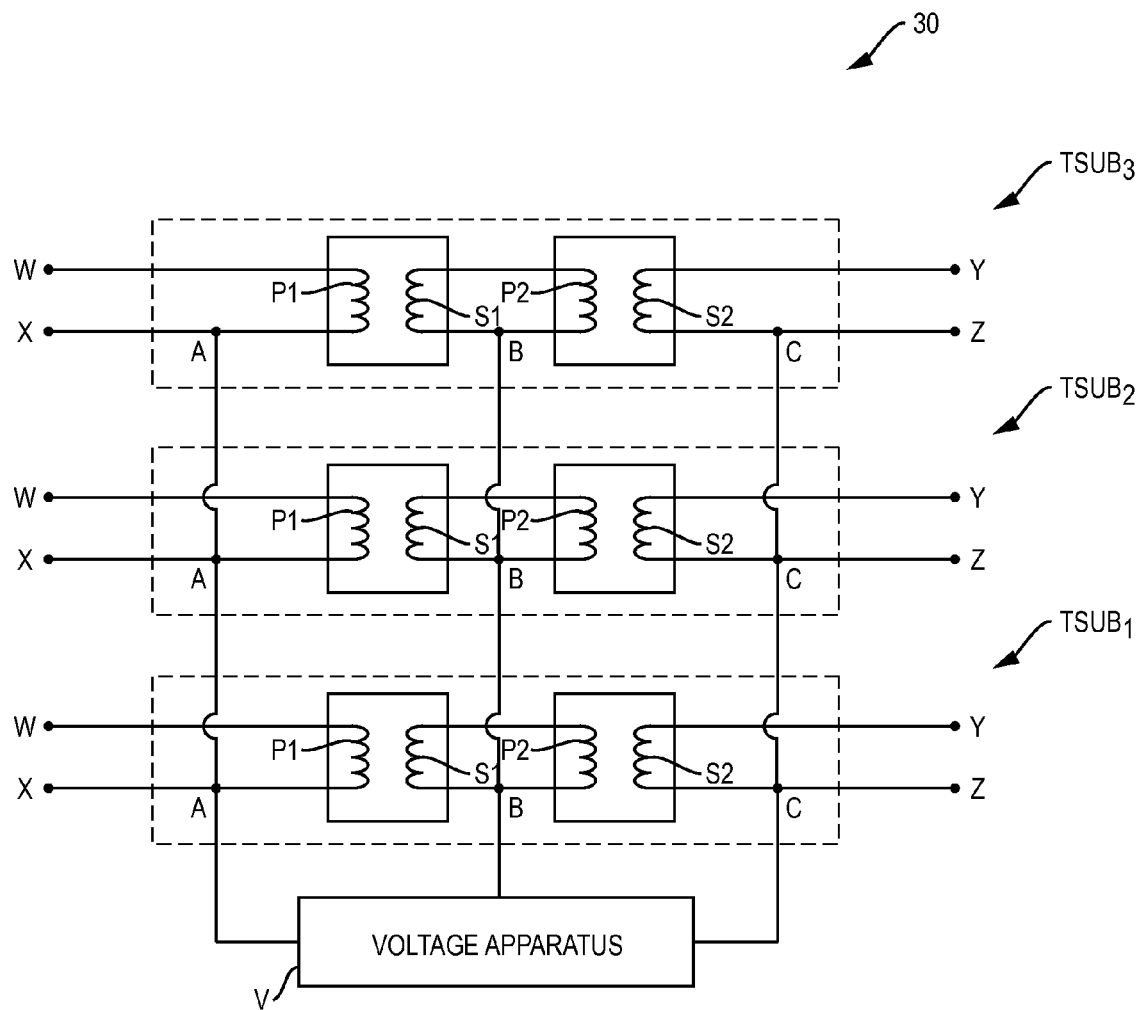
FIG. 3 schematically depicts a series-transformer isolation circuit having one inter-transformer coupling for each of three power phases, constructed in accordance with the invention.

The series-transformer sequences are adaptable to transmit power in equipment consuming multiphase power by providing, for each phase to be transmitted, a dedicated transformer subsystem, such as the two-transformer subsystem TSUB of the isolation circuit 10 or the three-transformer subsystem of the isolation circuit 20. With reference to FIG. 3, an illustrative multiphase series-transformer isolation circuit 30 for transmitting three-phase power to a high voltage comprises first, second, and third transformer two-transformer subsystems $TSUB_1$, $TSUB_2$, and $TSUB_3$. The voltage apparatus V is connected to the primary windings P1 of the first transformer T1 in each subsystem at the terminal point A; to the inter-transformer coupling T12 in each subsystem at the terminal point B; and to the secondary winding S2 of the second transformer T2 at the terminal point C. Each of the transformer subsystems $TSUB_1$, $TSUB_2$, and $TSUB_3$ has input terminals W and X for receiving one phase of power provided by an AC source (not shown) and output terminals Y and Z for delivering one phase of power to a load (not shown) at high-voltage.

The series-transformer isolation circuits of the illustrative embodiments may be particularly useful in devices that entail transmission of power across high voltages on the order of greater than 150 kV, such as, e.g., medical equipment and materials processing machinery.

Figure 4:
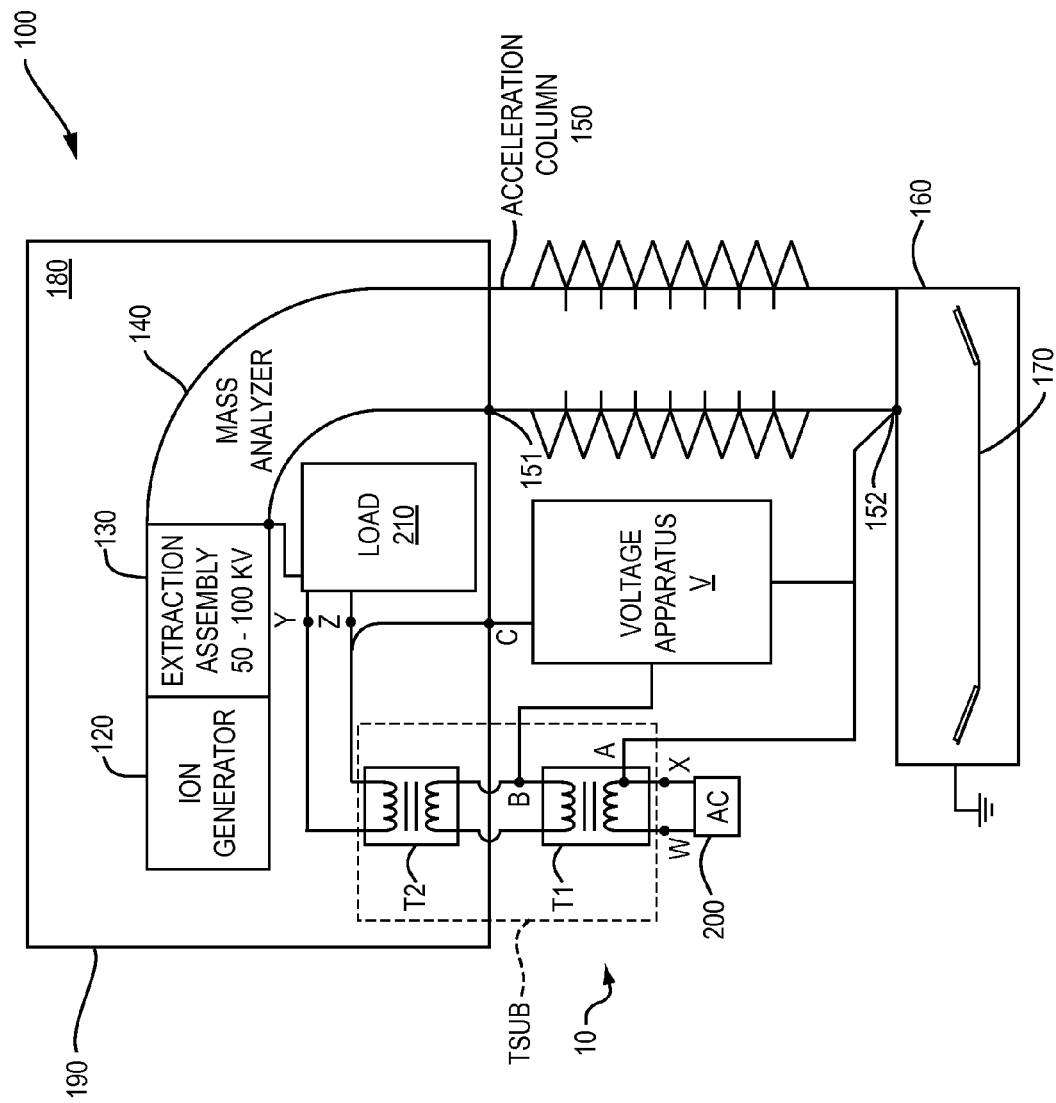
FIG. 4 schematically depicts an ion implanter incorporating the series-transformer isolation circuit constructed in accordance with the invention.

For example, the series-transformer isolation circuit may be situated in a high-energy ion implanter to drive ion acceleration. With reference to FIG. 4, a positive-ion implanter illustratively comprises an ion generator 120 supplied with a gas source (not shown), an ion-extraction assembly 130, a mass analyzer 140, an acceleration column 150, and an endstation 160 that houses a substrate appliance 170. A vacuum apparatus (not shown) is operable to maintain an ion pathway from the ion generator 120, through the extraction assembly 130, mass analyzer 140, acceleration column 150, and endstation 160 at low pressure during an implantation procedure. A high-voltage region 180 disposed within a high-voltage enclosure 190 may house elements of the ion implanter 100 operating at high voltage, such as the ion generator 120, extraction assembly 130, mass analyzer 140, a first end 151, distal with respect to the endstation 160, of the acceleration column 150, and ancillary devices such as pumps and power supplies.

The extraction assembly 130 comprises an extraction voltage source, disposed to electrostatically impel ions from the generator 120 and steer them toward the mass analyzer 140. The mass analyzer 140 is configured to sort extracted ions according to their respective mass/charge ratios, thereby selecting ions of interest for implantation.

The acceleration column 150 is configured to move ions down an accelerating voltage between the first end 151 and a second end 152, proximal with respect to the endstation 160, thereby bringing selected ions to a desired ultimate ion energy, or implant energy, before they reach the endstation 160. The first end 151 of the acceleration column 150 is, illustratively, electrically connected to the high-voltage enclosure 180.

In the endstation 160, an appliance 170 such as a disk is configured to bear substrates such as semiconductor wafers.

The endstation 160 is operable to rotate the disk 170 about an axis, thereby bringing the substrates successively before the path of impinging ions.

The function and cooperation of the ion generator 120, extraction assembly 130, mass analyzer 140, acceleration column 150, and endstation 160 to carry out ion implantation are described in co-owned U.S. application Ser. No. 12/122, 108, Parrill et al., entitled Ion Implanter for Photovoltaic Cell Fabrication, the disclosure of which is incorporated herein in its entirety by reference.

In an illustrative embodiment of the high-energy implanter 100, the series-transformer isolation circuit 10 is situated in the ion implanter 100 to maintain the high-voltage enclosure 190 at the total DC voltage, applied by the voltage apparatus V between terminal points A and C, with respect to the appliance 170. The second transformer T2 of the isolation circuit 10 may be disposed within the high-voltage enclosure 190.

The voltage apparatus V is configured to divide the total DC voltage into first and second fractional voltages sufficiently low to prevent breakdown of either of the first and second transformers T1 and T2. In related embodiments, the ion implanter 100 may be adapted for substitution of a three-transformer isolation circuit 20 or a multiphase isolation circuit 30 in place of the two-transformer isolation circuit 10.

An AC source 200 is configured to provide power at the input terminals W and X of the isolation circuit 10. The output terminals Y and Z of the isolation circuit 10 are configured to transmit power from the AC source 200 to a load 210 disposed within the high-voltage enclosure 190. The load 210 may include, e.g., motors for vacuum pumps, power supplies for magnets and other devices that drive function of the implanter 100. The function of such power-consuming devices in ion implanters is known to those skilled in the art.

In an exemplary procedure using the implanter 100 to implant positive high-energy ions in semiconductor wafers, the appliance 170 is loaded with wafers. The ion pathway of the ion implanter 100 is brought to low pressure, e.g., on the order of $10^{-4}$ Torr or lower. The endstation 160 is operated to rotate the appliance 170. The voltage apparatus V is operated to maintain the high-voltage enclosure 190 at the total DC voltage applied by the voltage apparatus V, with respect to the appliance 170. The total applied DC voltage may be, e.g., greater than about 100 kV, 200 kV, 300 kV, 400 kV, 500 kV or 600 kV. The AC power supply 200 is operated to transmit power, e.g., up to about 100 kW, to the load 210.

The ion generator 120 is activated to generate ions, which are extracted by the extraction assembly 130. The ions impelled into the mass analyzer 140 have respective energies corresponding to the extraction voltage which may be on the order of, e.g., 10 to 90 kV. Passing through the magnetic field of the mass analyzer 140, the ions are deflected according to their respective magnetic rigidities and splayed into distinct components. A component of interest, selected and transmitted from the mass analyzer 140, travels in a beam constituting a current of the ion of interest. The beam enters the acceleration column 150 at the first end 151. The total DC voltage applied between the first and second ends 151 and 152 of the acceleration column serves as an acceleration voltage for ions in the beam.

Acceleration through the column 150 augments the energy of the ions in the beam to an ultimate ion energy, or implant energy, corresponding to the sum of the extraction voltage and the acceleration voltage. Ions in the beam irradiate the wafers disposed on the disk 170 until the time integral of the current of the ion beam corresponds to a desired dose.

In one embodiment, the high-energy ion implanter 100 is adapted to implant hydrogen or helium ions preparatory to separating semiconductor laminae for photovoltaic applications. Techniques for making semiconductor laminae by cleaving after high-dose implantation of hydrogen or helium are described in co-owned U.S. application Ser. No. 12/057, 265, Sivaram et al., entitled Method to Form a Photovoltaic Cell Comprising a Thin Lamina, the disclosure of which is incorporated herein in its entirety by reference. Hydrogen, helium, or both are implanted in a wafer of semiconductor material, such as monocrystalline silicon, at a depth defining a cleave plane, which determines ultimate lamina thickness. Removal of the lamina from the implanted wafer is effected by, for example, annealing the wafer to provoke exfoliation of the lamina at the cleave plane. For preparation of efficient photovoltaic devices, lamina thicknesses of about 1 micron and greater are desirable. Devices may benefit from lamina thicknesses of, for example, 2 µm, 3 µm, or 4 µm and greater. The location of the cleave plane is related to the depth at which implanted ions come to rest in the wafer, which is largely dependent on the implant energy. Accordingly, an ion implanter useful for making laminae by this method preferably delivers an implant energy greater than about 100 keV and more preferably encompassing implant energies greater than about 150 keV, 200 keV, 250 keV, or 300 keV, 400 keV, 500 keV, 600 keV or greater. The optimal implant dose is on the order of $10^{16}$ ions/cm$^2$ or more, up to or greater than $10^{17}$ ions/cm$^2$. Such an implant dose may be delivered in an economical processing time by an ion beam conveying a current on the order of greater than 5 mA, 20 mA, 30 mA, 40 mA, 50 mA, 60 mA, 80 mA or 100 mA.

Figure 5:
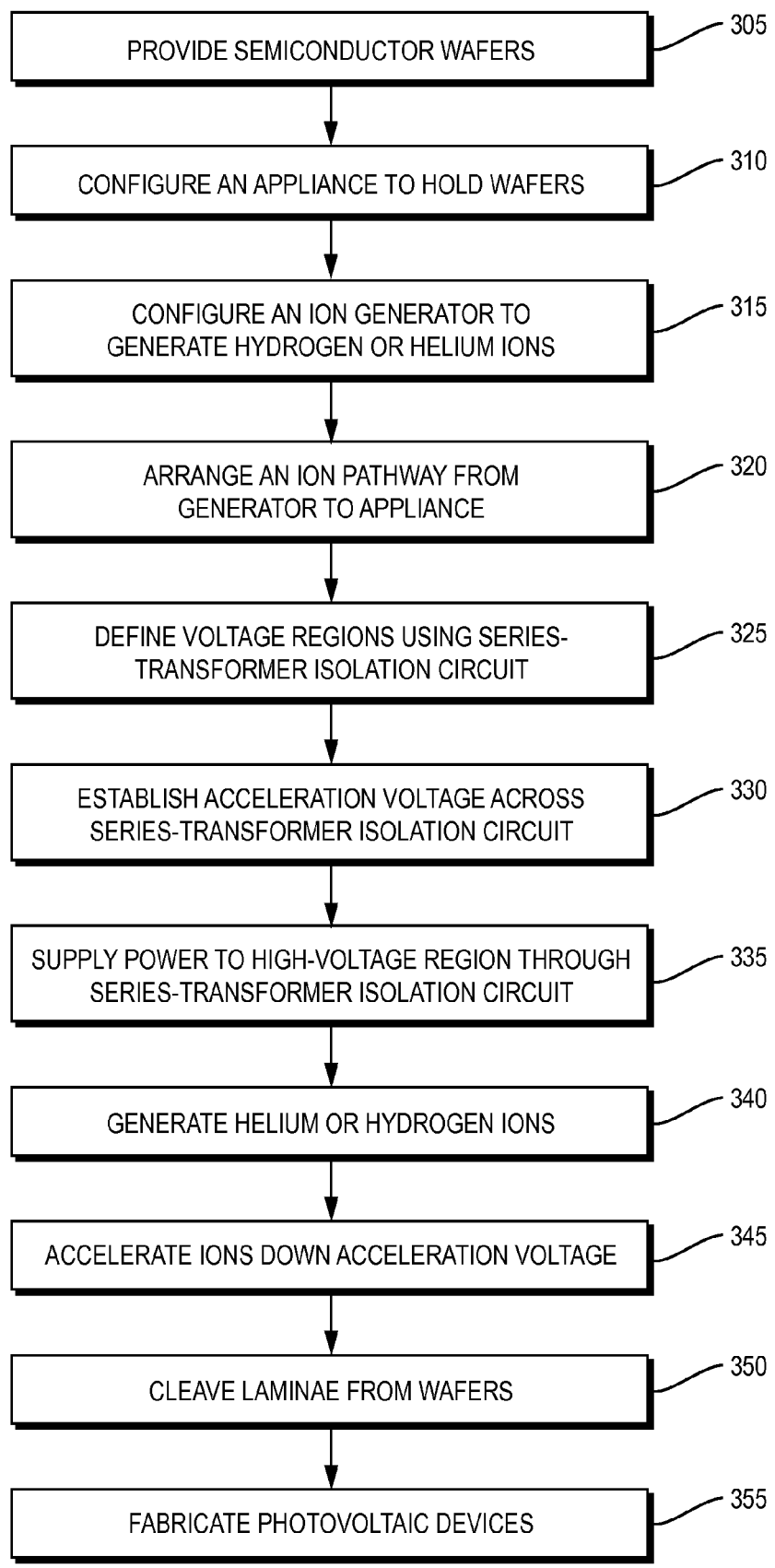
FIG. 5 is a flow diagram demonstrating an illustrative sequence of steps for making a photovoltaic device by ion implantation followed by lamina exfoliation according to the invention.

FIG. 5 demonstrates steps in an exemplary process sequence for fabricating photovoltaic devices from laminae prepared by accelerating ions through a potential difference imposed across the series-transformer isolation circuit. Wafers of, for example, polycrystalline or monocrystalline silicon are provided (step 305). An ion implanter such as the high-energy ion implanter 100 of FIG. 4 is configured to implant hydrogen ions in the wafers at high energies. In particular, the appliance 170 is configured to hold the wafers (step 310); the ion generator 120 of the ion implanter 100 is configured to generate hydrogen ions (step 315); and an ion pathway, for example the acceleration column 150, is arranged from the ion generator 120 to the appliance 170 (step 320).

A series-transformer isolation circuit, such as the two-transformer isolation circuit 10, is composed and connected to define higher- and lower-voltage parts of the ion implanter 100 (step 325). In particular, the voltage apparatus V is configured to apply a total DC voltage of, illustratively, about 320 kV between the terminal points A and C of the transformer subsystem TSUB, with the first and second fractional voltages being equal and each of the first and second transformers T1 and T2 having withstanding voltages greater than about 160 kV. Step 325 may further encompass, e.g., tying the terminal point A of the isolation circuit to the second end 152 of the acceleration column 150; tying the terminal point C to the first end 151 of the column 150 and the high-voltage enclosure 180; and connecting the output terminals Y and Z of the isolation circuit in the high-voltage region 180, for example to the load 210.

During implantation, the voltage apparatus V of the series-transformer isolation circuit 10 is operated to establish an acceleration voltage of about 320 kV along the ion pathway between the ion generator 120 and the appliance 170 (step 330), for example along the acceleration column 150. The AC source 200 is operated to supply, illustratively, about 75 kW of power at input terminals W and X of the transformer subsystem TSUB (step 335), thereby driving the function of implanter elements in the high-voltage region 180 of the implanter 100.

Hydrogen ions are generated by the ion generator 120 (step 340) and exposed to the acceleration voltage (step 345), for example at the first end 151 of the acceleration column 150. Processes between steps 340 and 345 may include, e.g., extracting the ions from the generator 120 to an extraction energy, illustratively about 80 keV, and selecting extracted ions for implantation. Hydrogen ions are driven by the acceleration voltage in an ion beam to an implant energy of about 400 keV, toward the appliance 170, and into the wafers.

The ion beam irradiates the wafers disposed on the appliance 170 until the time integral of the current of the ion beam illustratively corresponds to a dose of, e.g., $7 \times 10^{16}$ ions/cm$^2$, the implanted hydrogen ions defining a cleave plane in each wafer. The implanted wafers are removed from the ion implanter 100 and treated to effect cleaving of laminae from the wafers at cleave planes (step 350), for example by annealing. The laminae are about 4.0 µm thick. Photovoltaic devices are fabricated from the laminae by further processing (step 355), as described in Sivaram et al., earlier incorporated by reference.

Although specific features of the invention are included in some embodiments and not in others, it should be noted that individual feature may be combinable with any or all of the other features in accordance with the invention.

It will therefore be seen that the foregoing represents a highly advantageous approach to voltage isolation, particularly for use in high-energy ion implanters. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An electrical system comprising:
    a first transformer subsystem comprising
        a first transformer having a core, a primary winding, and a secondary winding, and
        a second transformer having a core, a primary winding, and a secondary winding, the primary winding of the second transformer coupled to the secondary winding of the first transformer to form a first inter-transformer coupling; and
    a voltage apparatus configured to apply
        a first DC voltage between the primary winding of the first transformer and the first inter-transformer coupling, and
        a second DC voltage between the first inter-transformer coupling and the secondary winding of the second transformer, thereby imposing a predetermined voltage distribution over the first transformer subsystem,
    wherein the first and second DC voltages sum to greater than 250 kV.

2. The electrical system of claim 1 wherein
    the first transformer subsystem further includes a third transformer having a core, a primary winding and a secondary winding, the primary winding of the third transformer coupled to the secondary winding of the second transformer to form a second inter-transformer coupling, and
    the voltage apparatus is further configured to apply a third DC voltage between the second inter-transformer coupling and the secondary winding of the third transformer.

3. The electrical system of claim 1 wherein the first transformer subsystem further includes respective conductive shields surrounding each of:
    the primary winding of the first transformer,
    the secondary winding of the first transformer,
    the primary winding of the second transformer, and
    the secondary winding of the second transformer, and
the voltage apparatus is configured to apply the first DC voltage between the conductive shields surrounding the primary and secondary windings of the first transformer and to apply the second DC voltage between the conductive shields surrounding the primary and secondary windings of the second transformer.

4. The electrical system of claim 1 wherein the first and second DC voltages sum to greater than 450 kV.

5. The electrical system of claim 1 wherein the first and second DC voltages are substantially equal.

6. The electrical system of claim 2 wherein the first, second and third DC voltages sum to greater than 600 kV.

7. The electrical system of claim 1 further comprising:
    an ac source configured to supply power to the primary winding of the first transformer; and
    an enclosure, in which the second transformer is disposed, electrically connected to the secondary winding of the second transformer.

8. The electrical system of claim 1 further comprising:
    a second transformer subsystem including a third transformer having a core, a primary winding and secondary winding and a fourth transformer having a core, a primary winding, and a secondary winding, the primary winding of the fourth transformer coupled to the secondary winding of the third transformer to form a second inter-transformer coupling;
    a third transformer subsystem including a fifth transformer having a core, a primary winding and secondary winding and a sixth transformer having a core, a primary winding, and a secondary winding, the primary winding of the sixth transformer coupled to the secondary winding of the fifth transformer to form a third inter-transformer coupling; and
    a multiphase power source configured to supply power of unique phases to the respective primary windings of each of the first, second and third transformer subsystems, wherein the voltage apparatus is further configured to impose the predetermined voltage distribution over the second and third transformer subsystems.

9. The electrical system of claim 8 further comprising a fourth transformer subsystem including a seventh transformer having a core, a primary winding, and a secondary winding and an eighth transformer having a core, a primary winding, and a secondary winding, wherein the multiphase power source is configured to supply power of unique phases to the respective primary windings of each of the first, second, third, and fourth transformer subsystems and the voltage apparatus is configured to impose the predetermined voltage distribution over the fourth transformer subsystem.

10. The electrical system of claim 1 further comprising:
    an appliance configured to hold a semiconductor wafer;
    an acceleration column having proximal and distal ends with respect to the appliance, the proximal end being electrically connected to one of the primary winding of the first transformer and the secondary winding of the second transformer, and the distal end being electrically connected to the other of the primary winding of the first transformer and the secondary winding of the second transformer;

an enclosure electrically connected to the secondary winding of the second transformer;

an ion source, disposed in the enclosure, configured to generate ions; and an ac source configured to supply power to the primary winding of the first transformer.

11. The ion implanter of claim 10 wherein the first and second DC voltages sum to at least 300 kV.

12. The electrical system of claim 10 further comprising an extraction apparatus configured to apply an extraction voltage between the ion source and the enclosure.

13. The electrical system of claim 10 wherein the second transformer is disposed in the enclosure.

14. The electrical system of claim 10 wherein the ion source is configured to generate ions of hydrogen or helium, the proximal end of the acceleration column is connected to the primary winding of the first transformer, the distal end of the acceleration column is connected to the secondary winding of the second transformer, and the acceleration column is configured to conduct ions of hydrogen or helium generated by the ion source to the appliance in an ion beam with augmentation of respective ion energies by the sum of the first and second DC voltages, so that ions of hydrogen or helium are implanted in the semiconductor wafer at a depth defining a cleave plane such that a lamina cleaved from the wafer by annealing is at least 1 μm thick and suitable for fabricating a photovoltaic device.

15. The electrical system of claim 14 wherein the first and second DC voltages sum to greater than 250 kV.

16. The electrical system of claim 14 wherein the ions of hydrogen or helium in the ion beam are implanted to a dose of at least $10^{16}$ ions/cm$^2$.

17. The electrical system of claim 14 wherein the ions of hydrogen or helium in the ion beam constitute a current of at least 20 mA.

18. The electrical system of claim 14 wherein the lamina has a thickness of at least 3 μm.

19. The electrical system of claim 1 further comprising an ac source configured to supply at least 75 kW to the primary winding of the first transformer.

20. An ion implanter comprising:
a first transformer subsystem comprising
a first transformer having a core, a primary winding, and a secondary winding, and
a second transformer having a core, a primary winding, and a secondary winding, the primary winding of the second transformer coupled to the secondary winding of the first transformer to form a first inter-transformer coupling; and a voltage apparatus configured to apply
a first DC voltage between the primary winding of the first transformer and the first inter-transformer coupling, and
a second DC voltage between the first inter-transformer coupling and the secondary winding of the second transformer, thereby imposing a predetermined voltage distribution over the first transformer subsystem; wherein the first and second DC voltages sum to greater than 250 kV;

an appliance configured to hold a semiconductor wafer;

an acceleration column having proximal and distal ends with respect to the appliance, the proximal end being electrically connected to one of the primary winding of the first transformer and the secondary winding of the second transformer, and the distal end being electrically connected to the other of the primary winding of the first transformer and the secondary winding of the second transformer;

an enclosure electrically connected to the secondary winding of the second transformer;

an ion source, disposed in the enclosure, configured to generate ions; and an ac source configured to supply power to the primary winding of the first transformer.

21. An electrical system comprising:
a first transformer subsystem comprising
a first transformer having a core, a primary winding, and a secondary winding, and
a second transformer having a core, a primary winding, and a secondary winding, the primary winding of the second transformer coupled to the secondary winding of the first transformer to form a first inter-transformer coupling; and a voltage apparatus configured to apply
a first DC voltage between the primary winding of the first transformer and the first inter-transformer coupling, and
a second DC voltage between the first inter-transformer coupling and the secondary winding of the second transformer, thereby imposing a predetermined voltage distribution over the first transformer subsystem, wherein the first and second DC voltages sum to greater than 250 kV, and an ac source configured to supply at least 75 kW to the primary winding of the first transformer.

* * * * *